US010728431B1

(12) United States Patent
Song et al.

(10) Patent No.: US 10,728,431 B1
(45) Date of Patent: Jul. 28, 2020

(54) FISH EYE CAMERA HAVING A BRACKET WHICH ELASTICALLY SUPPORTS PLURALITY OF LIGHT EMITTING DIODE (LED) SUBSTRATES

(71) Applicant: IDIS CO., LTD., Daejeon-si (KR)

(72) Inventors: Jin Kyu Song, Guri-si (KR); Chi Hwan Choi, Hanam-si (KR); Hyun Geun Ahn, Yongin-si (KR)

(73) Assignee: IDIS CO., LTD., Daejeon-si (KR)

( * ) Notice: Subject to any disclaimer, the term of this patent is extended or adjusted under 35 U.S.C. 154(b) by 0 days.

(21) Appl. No.: 16/373,659

(22) Filed: Apr. 3, 2019

(30) Foreign Application Priority Data

Jan. 22, 2019 (KR) .................. 10-2019-0008011

(51) Int. Cl.
*H04N 5/225* (2006.01)
*H05K 1/02* (2006.01)
*H04N 5/232* (2006.01)

(52) U.S. Cl.
CPC ......... *H04N 5/2252* (2013.01); *H04N 5/2256* (2013.01); *H04N 5/23238* (2013.01); *H05K 1/0274* (2013.01)

(58) Field of Classification Search
CPC ............... H04N 5/2252; H04N 5/2256; H04N 5/23238; H05K 1/0274
See application file for complete search history.

(56) References Cited

U.S. PATENT DOCUMENTS

| 2007/0206114 A1* | 9/2007 | Tanaka | G03B 15/03 348/371 |
| 2012/0008935 A1* | 1/2012 | Cheng | G03B 17/02 396/535 |
| 2016/0205318 A1* | 7/2016 | Wang | H04N 7/183 348/36 |
| 2017/0302834 A1* | 10/2017 | Lee | G02B 19/0066 |

FOREIGN PATENT DOCUMENTS

| JP | 2005-072600 A | 3/2005 |
| JP | 2015-076872 A | 4/2015 |
| KR | 10-2012-0005664 A | 1/2012 |
| KR | 10-2018-0001244 A | 1/2018 |

OTHER PUBLICATIONS

The Korean office action dated Mar. 16, 2020 for Korean Patent Application No. 10-2019-0008011.

* cited by examiner

*Primary Examiner* — Luong T Nguyen (57) ABSTRACT

A fish eye camera is provided. A main circuit board is fixed to an inside of a base housing. A middle housing is formed to cover both of the main circuit board and a camera module and fixed to the base housing in a state in which a fish eye lens of the camera module is drawn from the middle housing. A bracket includes a bracket body, which is insertion-coupled to a plurality of light emitting diode (LED) substrates and elastically supports the plurality of LED substrates in a state in which the plurality of LED substrates are arranged around an outer side of the middle housing, and metal bodies which are inserted into the bracket body to be (Continued)

in contact with the LED substrates. A cover housing is formed to cover both of the bracket and the middle housing and fixed to the base housing.

10 Claims, 12 Drawing Sheets

FISH EYE CAMERA HAVING A BRACKET WHICH ELASTICALLY SUPPORTS PLURALITY OF LIGHT EMITTING DIODE (LED) SUBSTRATES

CROSS-REFERENCE TO RELATED APPLICATION(S)

This application claims priority from Korean Patent Application No. 10-2019-0008011, filed on Jan. 22, 2019, in the Korean Intellectual Property Office, the disclosure of which is incorporated herein by reference in its entirety.

BACKGROUND

1. Field

The following description relates to a fish eye camera, and more specifically, to a fish eye camera which includes a fish eye lens and is capable of performing omnidirectional photographing.

2. Description of Related Art

Generally, surveillance cameras are installed and operated in places such as banks, government offices, hospitals, and offices that visitors need to be monitored or where security is required. For example, as described in Korean Patent Laid-Open Publication No. 10-2012-0005664 (Jan. 17, 2012), a surveillance camera can be formed as a fish eye camera including a fish eye lens in order to have a wider viewing angle. The fish eye lens is a super-wide-angle lens which is made using spherical aberration and forms an image having a viewing angle of 180° or more and having a minus distortion within a certain range of a limited extent. Accordingly, the fish eye camera can perform omnidirectional photographing through the fish eye lens.

Meanwhile, the fish eye camera may include infrared light emitting diodes (LEDs) to illuminate a subject with infrared rays so as to capture a clear image at night or in a place in which illuminance is low. In this case, the fish eye camera needs to be formed such that a process in which the infrared LEDs are assembled in a housing is simplified. In addition, the fish eye camera needs a proper heat dissipation structure so as to prevent damage of an inside thereof due to heat generated by the infrared LEDs, and particularly, by high power infrared LEDs.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to a fish eye camera of which an assembly process is simplified and thermal damage is prevented by a proper heat dissipation structure.

In one general aspect, a fish eye camera includes a base housing, a main circuit board, a camera module, a middle housing, a plurality of light emitting diode (LED) substrates, a bracket, and a cover housing. The main circuit board is fixed to an inside of the base housing. The camera module is connected to the main circuit board at the inside of the base housing and performs omnidirectional photographing through a fish eye lens. The middle housing is formed to cover both of the main circuit board and the camera module and is fixed to the base housing in a state in which the fish eye lens is drawn from the middle housing. Each of the plurality of LED substrates includes at least one infrared LED mounted thereon and is connected to the main circuit board. The bracket includes a bracket body, which is insertion-coupled to the LED substrates and elastically supports the LED substrates in a state in which the LED substrates are arranged around an outer side of the middle housing, and metal bodies which are inserted into the bracket body to be in contact with the LED substrates. The cover housing is formed to cover both of the bracket and the middle housing and fixed to the base housing.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, the invention will be described in detail with reference to the accompanying drawings. Here, like reference numerals denote like elements, and a repeated description and detailed descriptions of known functions and configurations that may unnecessarily obscure the gist of the invention will not be repeated. Embodiments of the invention are provided in order to fully explain the invention for those skilled in the art. Therefore, shapes and sizes of the elements in the drawings may be exaggerated for a more precise description.

Figure 1:
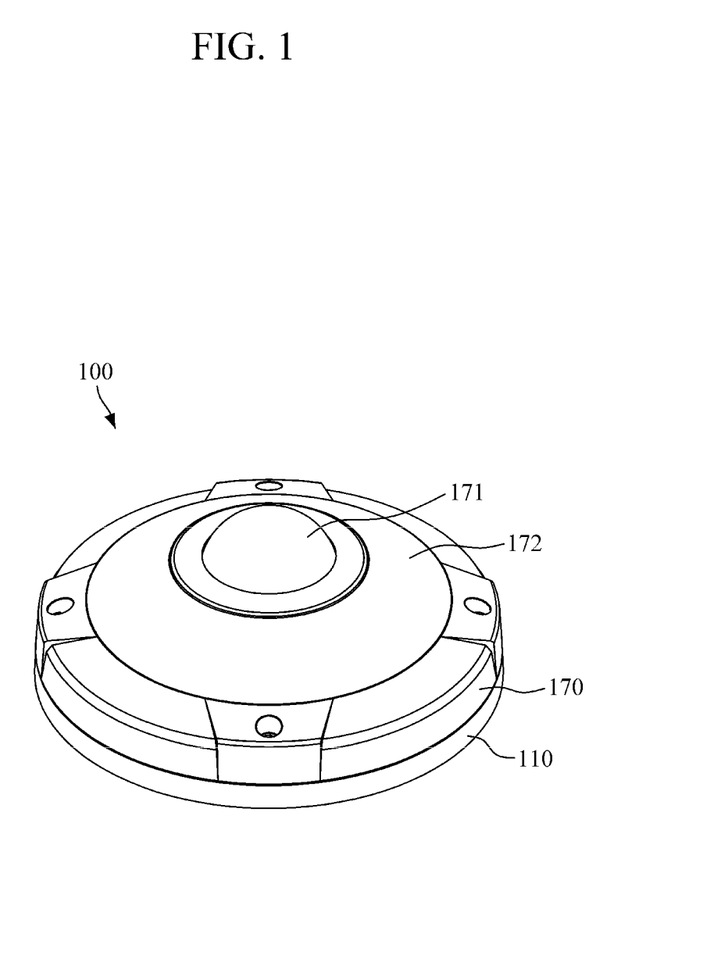
FIG. 1 is a perspective view illustrating a fish eye camera according to one embodiment of the present invention.
Figure 2:
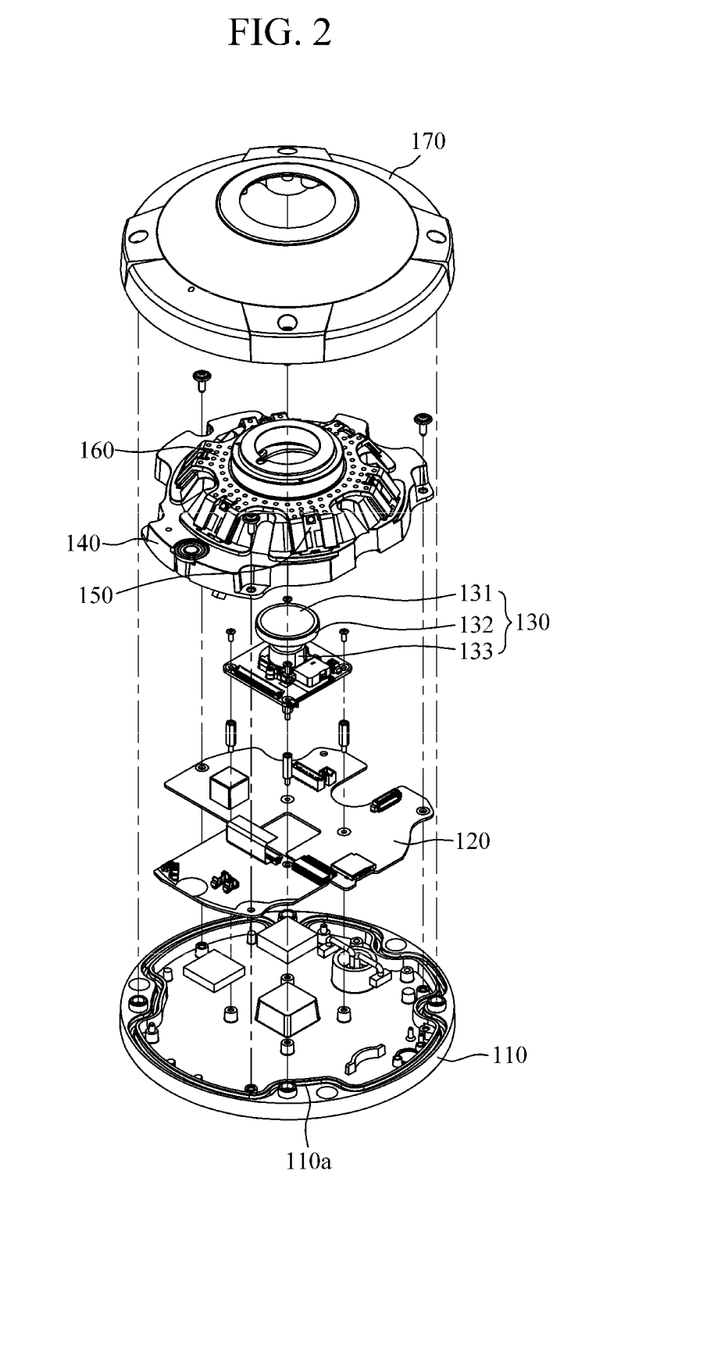
FIG. 2 is an exploded perspective view of FIG. 1.
Figure 3:
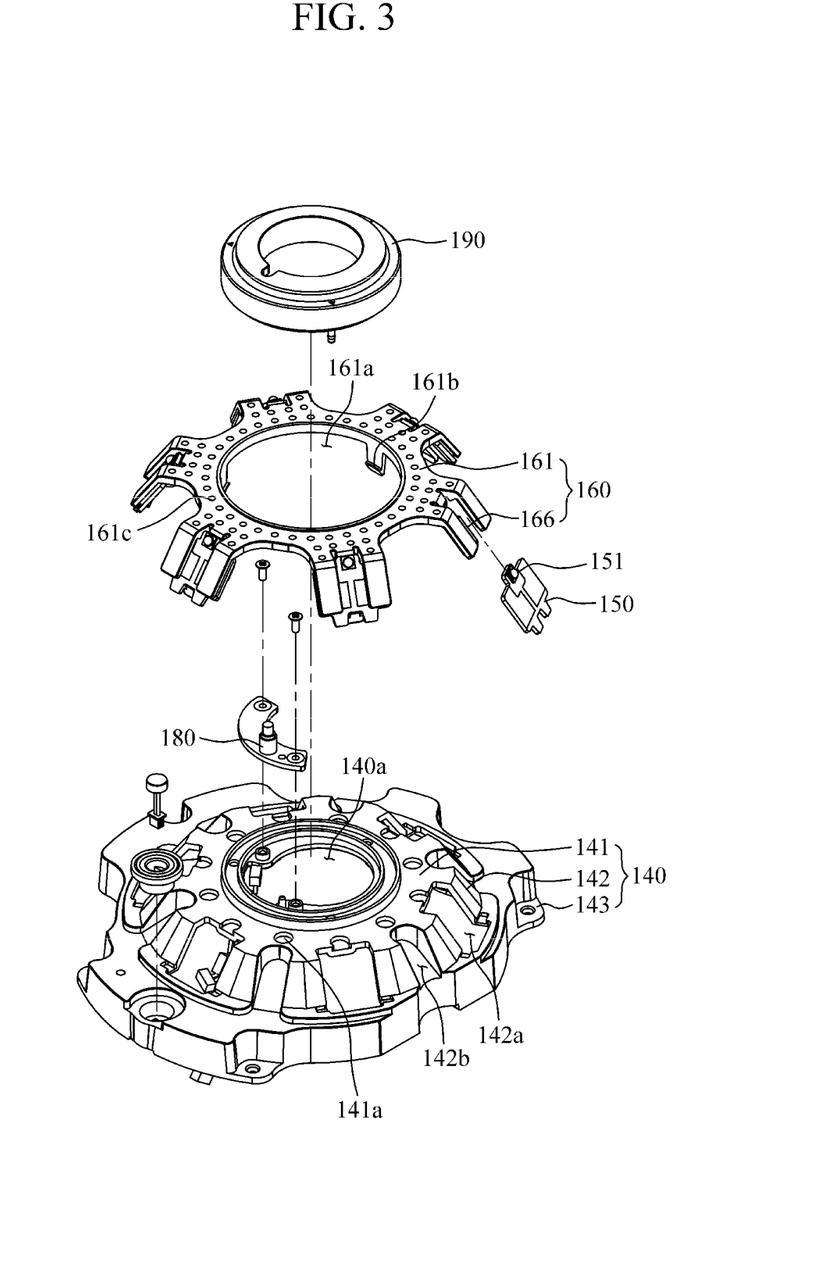
FIG. 3 is an exploded perspective view illustrating a bracket separated from a middle housing in FIG. 2.

FIG. 1 is a perspective view illustrating a fish eye camera according to one embodiment of the present invention. FIG. 2 is an exploded perspective view of FIG. 1. FIG. 3 shows perspective views illustrating a middle housing and a bracket in FIG. 2.

Referring to FIGS. 1 to 3, a fish eye camera 100 according to one embodiment of the present invention includes a base housing 110, a main circuit board 120, a camera module 130, a middle housing 140, a plurality of LED substrates 150, a bracket 160, and a cover housing 170.

An outer portion of the base housing 110 is fixed to a ceiling or wall of a building or the like so that the fish eye camera 100 may be mounted on the ceiling or wall. An inside of the base housing 110 may have a flat surface. The base housing 110 may include coupling structures therein to be bolt-coupled to the main circuit board 120, the camera module 130, the middle housing 140, and the cover housing 170

An outer circumference of the base housing 110 may be formed in a circular shape. A flange 110a may be formed along an inner edge of the base housing 110. An outer wall of the flange 110a of the base housing 110 may be covered and supported by an outer portion of the cover housing 170.

The main circuit board 120 is fixed to the inner side of the base housing 110. The main circuit board 120 may be bolt-coupled to the inside of the base housing 110. The main circuit board 120 is connected to the camera module 130 and the LED substrates 150. The main circuit board 120 may be connected to a power cable and a communication cable.

The main circuit board 120 may receive an external power signal and a control signal, transmit the external power signal and the control signal to the camera module 130 to operate the camera module 130, and receive a signal of an image captured by the camera module 130 to output the signal to the outside. In addition, the main circuit board 120 may output the external power signal and the control signal to the LED substrates 150 to operate the infrared LEDs 151.

The camera module 130 is connected to the main circuit board 120 at the inside of the base housing 110. The camera module 130 may be bolt-coupled to the inside of the base housing 110. The camera module 130 performs omnidirectional photographing through a fish eye lens 131. The fish eye lens 131 is a super-wide-angle lens formed with spherical aberration.

In the camera module 130, the fish eye lens 131 may be installed in and supported by a lens barrel 132. In the camera module 130, an image sensor (not shown) may be embedded in a casing 133 connected to the lens barrel 132. The image sensor converts an optical image formed by the fish eye lens 131 into an electrical signal. Accordingly, the camera module 130 may transmit an image formed by omnidirectional photographing performed through the fish eye lens 131 to the main circuit board 120.

The middle housing 140 is formed to cover both of the main circuit board 120 and the camera module 130 and is fixed to the base housing 110 in a state in which the fish eye lens 131 is drawn from the middle housing 140. The middle housing 140 may be bolt-coupled to the inside of the base housing 110. As the middle housing 140 is formed to have a shape having a cavity at a side thereof facing the base housing 110, a space for accommodating the main circuit board 120 and the camera module 130 is formed between the middle housing 140 and the base housing 110.

The fish eye lens 131 may be drawn from the middle housing 140 through a center hole 140a. The center hole 140a may be formed to have a circular shape. The middle housing 140 may include a center horizontal portion 141 and an inclined portion 142. The center horizontal portion 141 is formed to have a horizontal surface around the center hole 140a when an inner surface of the base housing 110 is horizontally disposed. The inclined portion 142 is formed to obliquely extend from an outer side of the center horizontal portion 141 in a radial direction thereof. In the middle housing 140, coupling portions 143 may be formed at an outer side of the inclined portion 142 so as to be coupled to the base housing 110.

In the middle housing 140, an illuminance sensor 180 may be installed around the center hole 140a. The illuminance sensor 180 may detect brightness therearound such that operation of the infrared LED 151 is controlled. In a state in which the fish eye lens 131 is drawn through the center hole 140a of the middle housing 140, a ring support 190 may be fitted to an outer side of the fish eye lens 131.

In a state in which the ring support 190 surrounds the fish eye lens 131, the ring support 190 may be inserted into the center hole 140a of the middle housing 140 to support the fish eye lens 131. The ring support 190 may include a hole for exposing a sensing portion of the illuminance sensor 180. The ring support 190 may be formed of an elastic material such as rubber or silicone.

At least one infrared LED 151 is mounted on each of the plurality of LED substrates 150, and the plurality of LED substrates 150 are connected to the main circuit board 120. The infrared LEDs 151 illuminate a subject with infrared rays such that the camera module 130 may clearly capture an image. The infrared LEDs 151 are mounted on the corresponding surfaces of the LED substrates 150 facing the cover housing 170. As an example, the number of the LED substrates 150 is six, but the number is not limited thereto.

The bracket 160 includes a bracket body 161 and metal bodies 166. In a state in which the LED substrates 150 are arranged around an outer side of the middle housing 140, the bracket body 161 is insertion-coupled to the LED substrates 150 to elastically support the LED substrates 150. The bracket body 161 may be insertion-coupled to the LED substrates 150 in a state in which the LED substrates 150 are arranged at predetermined intervals. Accordingly, since the plurality of LED substrates 150 are disposed to be spaced apart from each other around the outer side of the middle housing 140, the plurality of LED substrates 150 may illuminate at a wide angle for omnidirectional photographing of the camera module 130. The bracket body 161 may be formed of a resin material by injection molding. Accordingly, the bracket body 161 may be formed of an electrical nonconductor, that is, an insulator.

The fish eye lens 131 may be drawn from the bracket body 161 through a center hole 161a. The bracket body 161 may include hooks 161b protruding toward the middle housing 140 around the center hole 161a. In a state in which the bracket body 161 is disposed to cover the middle housing 140, the hooks 161b may pass through the center hole 140a of the middle housing 140 and may be hooked around the center hole 140a of the middle housing 140 to fix the bracket body 161 to the middle housing 140.

As described above, even when the plurality of LED substrates 150 are disposed to be spaced apart from each other around the outer side of the middle housing 140, a process of assembling the plurality of LED substrates 150 and the bracket body 161 is simplified, and thus convenience in assembly can be improved.

In addition, since the LED substrates 150 are fixed to the bracket body 161 in the present embodiment, the bracket body 161 may be coupled to the middle housing 140 by the hooks 161b even without being bolt-coupled to the middle housing 140 when compared to a comparative embodiment in which a bracket is bolt-coupled to a middle housing in a state in which LED substrates are covered with the bracket and pressed against an outer side of the middle housing. As a result, convenience in assembly can be further improved.

The metal bodies 166 are inserted into the bracket body 161 to be in contact with the LED substrates 150. When the LED substrates 150 generate heat due to the operation of the infrared LEDs 151, the metal bodies 166 receive heat from the LED substrates 150 and exchange the heat with surrounding air to smoothly dissipate the heat of the LED substrates 150. Accordingly, an inner portion of the fish eye camera 100 due to heat generated by the infrared LEDs 151, particularly, by high power infrared LEDs, can be prevented from being damaged.

The metal bodies 166 may be integrated with the bracket body 161 formed of a resin material by insert-injection molding. Since the bracket body 161 is injection-molded using an injection mold in a state in which the metal bodies 166 are inserted into the injection mold, the metal bodies 166 may be integrated with the bracket body 161.

The bracket body 161 may include heat dissipation holes 161c for exposing the metal bodies 166. The bracket body 161 may include the heat dissipation holes 161c in a surface opposite to a surface facing the middle housing 140. Since the metal bodies 166 are in contact with surrounding air through the heat dissipation holes 161c, heat exchange between the metal bodies 166 and the surrounding air occurs more smoothly, and thus a heat dissipation effect can be improved.

The cover housing 170 is formed to cover both of the bracket 160 and the middle housing 140 and fixed to the base housing 110. A circumference of an outer side of the cover housing 170 may be formed to have a circular shape. The cover housing 170 may be bolt-coupled to the base housing 110 in a state in which the outer portion of the cover housing 170 surrounds an outer wall of the flange 110a of the base housing 110.

The cover housing 170 may include a center hole corresponding to the fish eye lens 131. A window 171 may cover the center hole of the cover housing 170 to protect the fish eye lens 131. The window 171 has optical transmissivity such that a subject may be photographed through the fish eye lens 131. The window 171 may be formed to have a dome shape. An infrared ray pass filter 172 may be formed around the center hole of the cover housing 170. The infrared ray pass filter 172 is a filter through which frequencies only in a wavelength band of infrared rays pass, and black masking may be performed on the infrared ray pass filter 172 such that an operation state of the infrared LEDs 151 is not visible from the outside.

According to the above-described fish eye camera 100, a process of assembling the bracket 160, the middle housing 140, and the LED substrates 150 can be simplified, and thermal damage can be prevented due to a proper heat dissipation structure.

Figure 4:
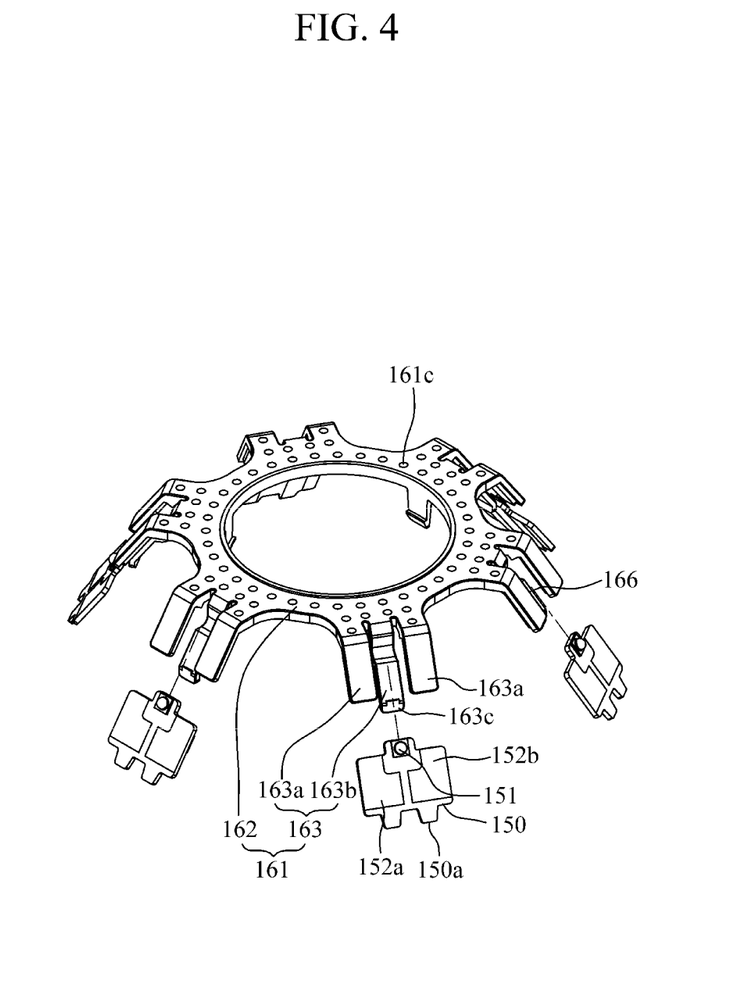
FIG. 4 is an exploded perspective view illustrating a state in which light emitting diode (LED) substrates are separated from the bracket.
Figure 5:
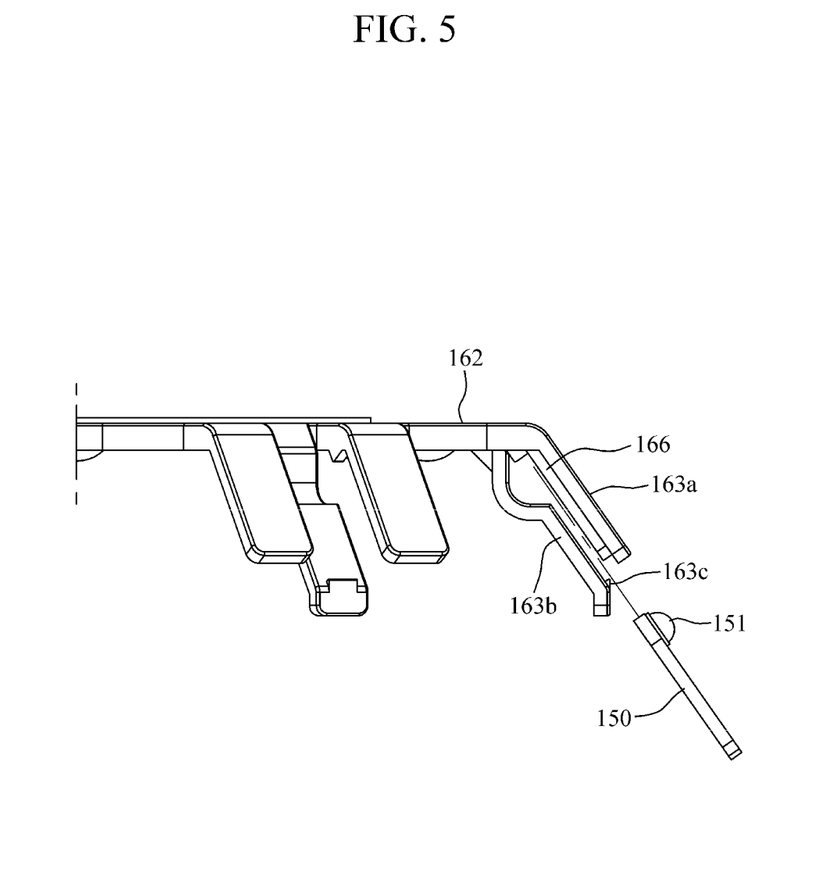
FIG. 5 is a side view of FIG. 4.
Figure 6:
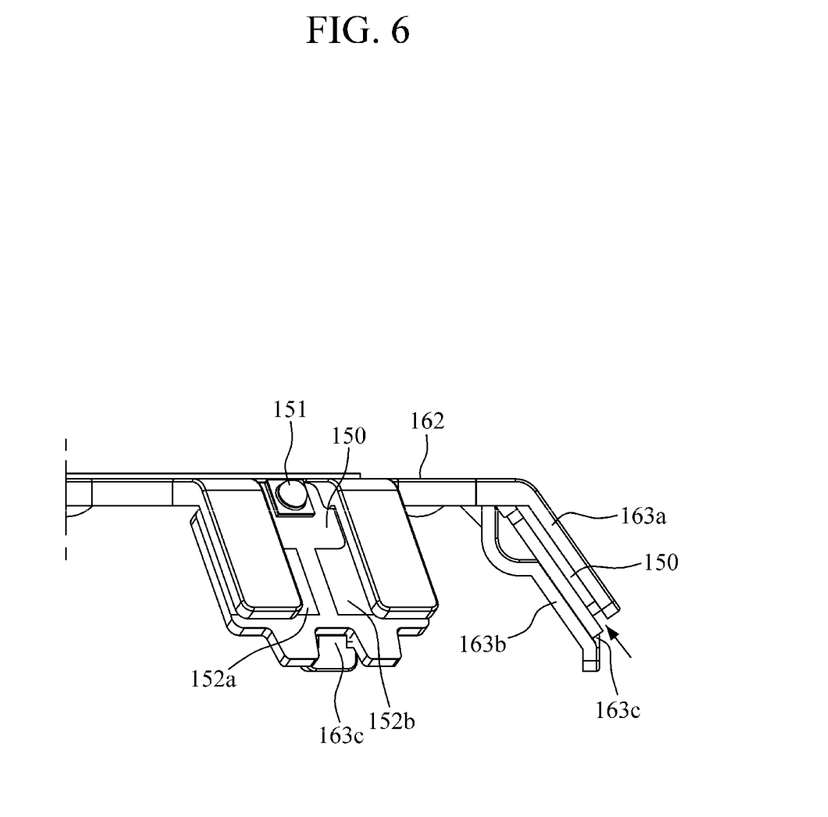
FIG. 6 is a side view for describing a process in which the LED substrate is insertion-coupled to the bracket in FIG. 5.
Figure 7:
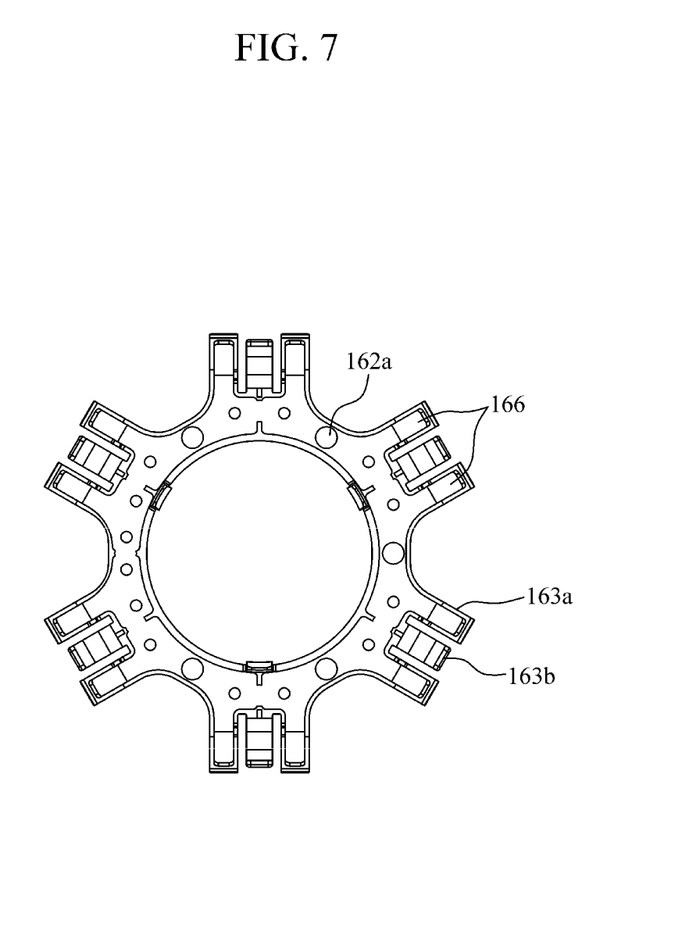
FIG. 7 is a view illustrating an inside of the bracket.

FIG. 4 is an exploded perspective view illustrating a state in which light emitting diode (LED) substrates are separated from the bracket. FIG. 5 is a side view of FIG. 4. FIG. 6 is a side view for describing a process in which the LED substrate is insertion-coupled to the bracket in FIG. 5. FIG. 7 is a view illustrating the inside of the bracket.

Referring to FIGS. 4 to 7, the bracket body 161 may be formed to be slidably insertion-coupled to the LED substrates 150. Accordingly, a process of assembling the bracket body 161 and the LED substrates 150 can be simplified. The bracket body 161 may include a center bracket portion 162 and holding portions 163.

The center bracket portion 162 is formed to surround the fish eye lens 131 from the outer side of the middle housing 140. That is, the center bracket portion 162 may be formed to surround the fish eye lens 131 in a state in which the fish eye lens 131 is drawn from the center bracket portion 162 through the center hole 161a. Since a surface of the center bracket portion 162 facing the middle housing 140 is flat, the center bracket portion 162 is in surface contact with the center horizontal portion 141 of the middle housing 140, and thus the center bracket portion 162 can be stably supported. The heat dissipation holes 161c may be formed in the center bracket portion 162.

The center bracket portion 162 may include alignment protrusions 162a protruding toward the middle housing 140. The alignment protrusions 162a may be arranged at predetermined intervals in a circumferential direction of the center bracket portion 162. In this case, as illustrated in FIG. 3, the center horizontal portion 141 of the middle housing 140 may include alignment holes 141a into which the alignment protrusions 162a of the center bracket portion 162 are inserted when the center bracket portion 162 is disposed. Accordingly, the bracket 160 may be aligned to be disposed on the middle housing 140.

The holding portions 163 are arranged along an outer side of the center bracket portion 162 and slidably insertion-coupled to the LED substrates 150 in a radial direction toward a center of the middle housing 140 to elastically support the LED substrates 150. The holding portions 163 are arranged at predetermined intervals. Here, each of the holding portions 163 may include a pair of supporting pieces 163a and an elastic piece 163b.

The pair of supporting pieces 163a protrude from the outer side of the center bracket portion 162 in a state in which the pair of supporting pieces 163a are spaced apart from each other in the circumferential direction of the center bracket portion 162 and are in contact with both sides of one surface of the corresponding LED substrate 150. The metal bodies 166 may be formed to be exposed from the supporting pieces 163a so as to be in contact with the LED substrates 150. In this case, the supporting pieces 163a may support the LED substrates 150 in a state in which the metal bodies 166 are in contact with the LED substrates 150. The supporting pieces 163a may be bent to protrude from the center bracket portion 162 at angles which are the same as that of the inclined portion 142 of the middle housing 140. The supporting piece 163a may be formed to have a predetermined width and a predetermined thickness. The supporting piece 163a may be formed to have a square bar shape.

The elastic piece 163b protrudes between the supporting pieces 163a from the outer side of the center bracket portion 162 and elastically supports the other surface of the corresponding LED substrate 150. Since the elastic piece 163b is elastically deformed when the LED substrate 150 is inserted between the corresponding supporting pieces 163a in a radial direction of the center bracket portion 162, the LED substrate 150 can be elastically pressed and fixed to the corresponding supporting pieces 163a.

Accordingly, the holding portion 163 may be slidably insertion-coupled to the corresponding LED substrate 150 in the radial direction of the center bracket portion 162 to elastically support the LED substrate 150. In a case in which the metal bodies 166 electrically connect the LED substrates 150, the elastic piece 163b may stably maintain electrical contacts between the LED substrate 150 and the metal bodies 166 in addition to contacts for heat dissipation there between.

A portion of the elastic piece 163b connected to the center bracket portion 162 may be formed to have a shape convexly curved in a direction farther away from the corresponding LED substrate 150. Accordingly, the elastic piece 163b may increase an elastic force for pressing the corresponding LED substrate 150 and also prevent damage of a portion connected to the center bracket portion 162.

In the case in which the holding portions 163 are formed to have the above-described structure, as illustrated in FIG. 3, the inclined portion 142 of the middle housing 140 may include edge holes 142a corresponding to the holding portions 163 in a circumferential direction thereof. The edge hole 142a may be formed to have a quadrangular shape. In a state in which the bracket 160 is disposed on the middle housing 140, an edge of the edge hole 142a may support the corresponding LED substrate 150 adjacent thereto such that the elastic piece 163b may pass through the edge hole 142a. In addition, the edge hole 142a may hook and support protrusions 150a formed at both sides of a rear end of the corresponding LED substrate 150 inward. The inclined portion 142 of the middle housing 140 may include additional holes 142b between the edge holes 142a. The additional holes 142b may contribute to heat dissipation or reducing weight of the middle housing 140.

The elastic piece 163b may include a hooking step 163c protruding to hook the rear end of the corresponding LED substrate 150 in an insertion direction of the corresponding LED substrate 150. Accordingly, the LED substrate 150 may be further stably fixed in a state in which the LED substrate 150 is insertion-coupled to the holding portion 163. The hooking step 163c may be formed to be in surface contact with the rear end of the corresponding LED substrate 150. Since a protruding end of the elastic piece 163b is bent in a direction farther away from the supporting pieces 163a, the LED substrate 150 can be smoothly inserted between the elastic piece 163b and the corresponding supporting pieces 163a.

Figure 8:
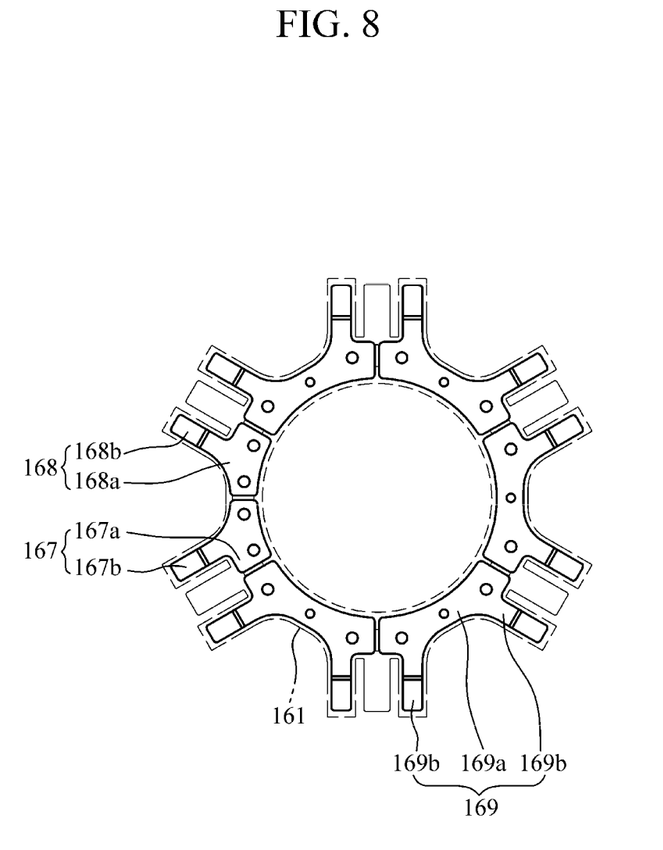
FIG. 8 is a view illustrating an example of a metal plate to be inserted into a bracket body.

The metal bodies 166 may be formed to connect the LED substrates 150 in series. That is, the metal bodies 166 may serve a function of dissipating heat of the LED substrates 150 and may also serve a function of electrically connecting the LED substrates 150. Specifically, the LED substrates 150 may include first and second electrodes 152a and 152b connected to the corresponding infrared LEDs 151. The LED substrate 150 may include the first and second electrodes 152a and 152b on the surface thereof facing the cover housing 170. In addition, as illustrated in FIG. 8, the metal bodies 166 may include a first metal piece 167, a second metal piece 168, and third metal pieces 169.

The first and second metal pieces 167 and 168 are respectively in contact with the first electrode 152a of one LED substrate 150 of two adjacent LED substrates 150 and the second electrode 152b of the other LED substrate 150 thereof in any one region corresponding to a region between the LED substrates 150.

Figure 9:
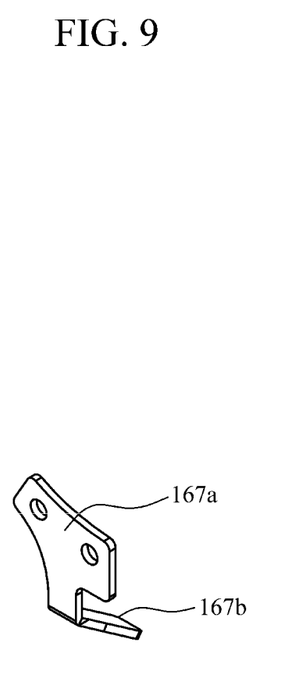
FIG. 9 is a perspective view illustrating a first metal piece of FIG. 8.

As illustrated in FIG. 9, a body portion 167a of the first metal piece 167 is embedded under the center bracket portion 162, and an extension portion 167b is bent to extend from the body portion 167a to be parallel to the corresponding supporting piece 163a. The body portion 167a may include a through hole. Since a part of the bracket body 161 is formed in the through hole of the body portion 167a when the bracket body 161 is injection-molded, the body portion 167a may be more firmly fixed to the bracket body 161.

The extension portion 167b may be exposed from the corresponding supporting piece 163a toward the corresponding LED substrate 150 and may be in contact with the first electrode 152a of the corresponding LED substrate 150. The extension portion 167b may be formed to be in surface contact with the first electrode 152a of the corresponding LED substrate 150 for stable contact. The extension portion 167b may be formed to have a predetermined width and a predetermined thickness. The first metal piece 167 may be exposed from the corresponding supporting piece 163a with a predetermined thickness.

Figure 10:
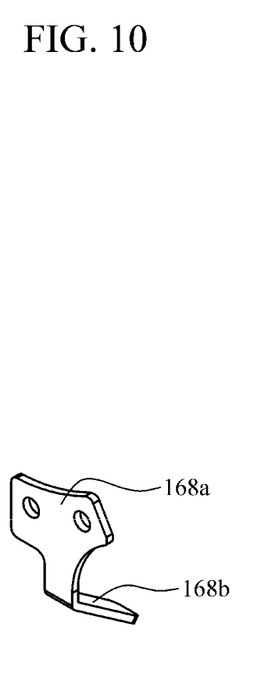
FIG. 10 is a perspective view illustrating a second metal piece of FIG. 8.

As illustrated in FIG. 10, a body portion 168a of the second metal piece 168 is embedded under the center bracket portion 162, and an extension portion 168b is bent to extend from the body portion 168a to be parallel to the corresponding supporting piece 163a. The body portion 168a may include a through hole. Since a part of the bracket body 161 is formed in the through hole of the body portion 168a when the bracket body 161 is injection-molded, the body portion 168a may be more firmly fixed to the bracket body 161.

The extension portion 168b may be exposed from the corresponding supporting piece 163a toward the corresponding LED substrate 150 and may be in contact with the second electrode 152b of the corresponding LED substrate 150. The extension portion 168b may be formed to be in surface contact with the second electrode 152b of the corresponding LED substrate 150 for stable contact. The extension portion 168b may be formed to have a predetermined width and a predetermined thickness. The second metal piece 168 may be exposed from the corresponding supporting piece 163a with a predetermined thickness. The second metal piece 168 may be formed to be symmetrical to the first metal piece 167.

Each of the third metal pieces 169 is commonly in contact with both of the first electrode 152a of any one LED substrate 150 of two adjacent LED substrates 150 and the second electrode 152b of the other LED substrate 150 thereof to electrically connect the corresponding first and second electrodes 152a and 152b in each of regions corresponding to the remaining regions between the LED substrates 150. The third metal piece 169 is formed of an electrically conductive metal material.

Figure 11:
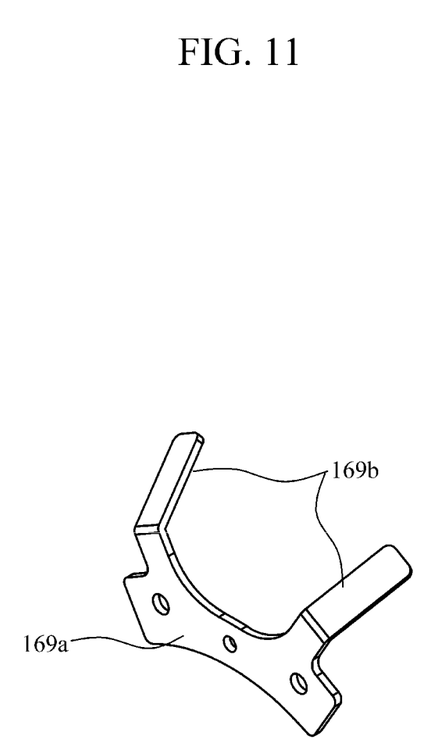
FIG. 11 is a perspective view illustrating a third metal piece of FIG. 8.

As illustrated in FIG. 11, a body portion 169a of the third metal piece 169 is embedded under the center bracket portion 162, and a pair of extension portions 169b may be bent to extend from the body portion 169a to be parallel to the corresponding supporting pieces 163a. The body portion 169a may include a through hole. As a part of the bracket body 161 is formed in the through hole of the body portion 169a when the bracket body 161 is injection-molded, the body portion 169a may be more firmly fixed to the bracket body 161.

The extension portions 169b may be exposed from the corresponding supporting pieces 163a toward the corresponding LED substrate 150 and may be in contact with the first and second electrodes 152a and 152b of the corresponding LED substrates 150. The extension portions 169b may be formed to be in surface contact with the first and second electrodes 152a and 152b of the corresponding LED substrate 150 for stable contact. The extension portion 169b may be formed to have a predetermined width and a predetermined thickness. The third metal piece 169 may be exposed from the corresponding supporting piece 163a with a predetermined thickness.

Figure 12:
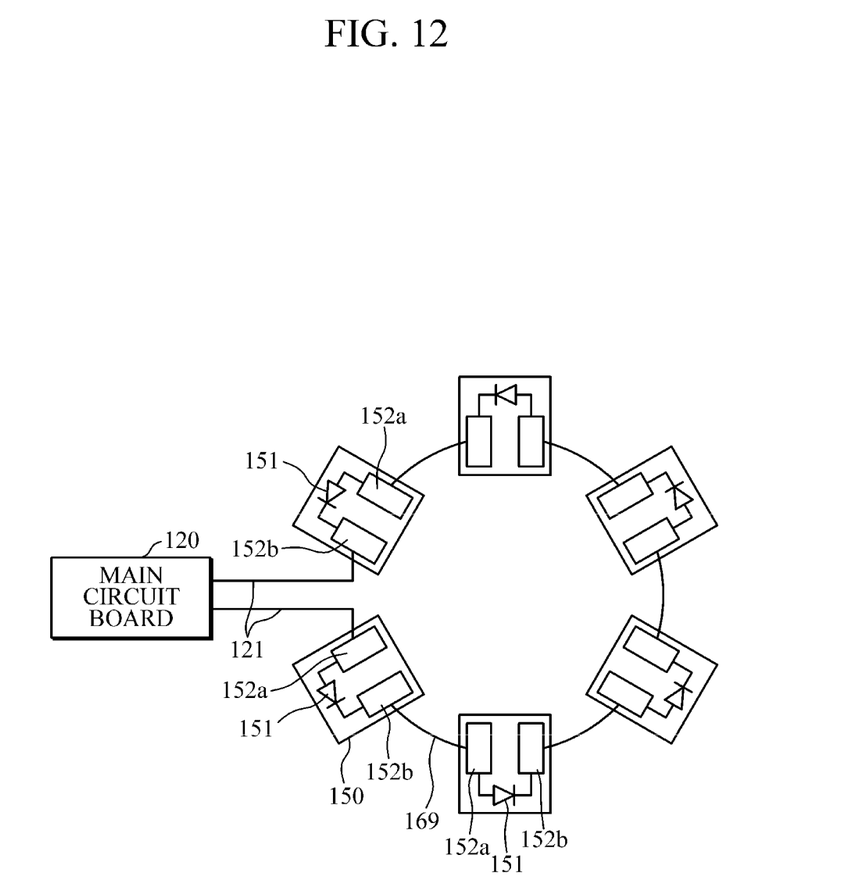
FIG. 12 is a configuration diagram illustrating an example in which the LED substrates are connected in series by metal plates.

Accordingly, as illustrated in FIG. 12, all of the LED substrates 150 may be connected in series by the third metal pieces 169 when the first and second electrodes 152a and 152b in contact with the first and second metal pieces 167 and 168 are connected to the main circuit board 120 by a connector 121. As described above, in the present embodiment, since all of the LED substrates 150 may be connected in series when only the first and second electrodes 152a and 152b in contact with the first and second metal pieces 167 and 168 are connected to the main circuit board 120 by the connector 121, a process in which the LED substrates 150 are connected to the main circuit board 120 may be simplified when compared to a comparative embodiment in which LED substrates are connected to a main circuit board by connectors one by one. As a result, process efficiency can be improved.

According to the present invention, a process of assembling a bracket, a middle housing, and light LED substrates can be simplified, and thermal damage can be prevented by a proper heat dissipation structure.

The present invention has been described with reference to the example embodiments illustrated in the drawings, but these are only examples. It will be understood by those skilled in the art that various modifications and equivalent other example embodiments may be made. Therefore, the scope of the present invention is defined by the appended claims.

REFERENCE NUMERALS

110: BASE HOUSING
120: MAIN CIRCUIT BOARD
130: CAMERA MODULE
131: FISH EYE LENS
140: MIDDLE HOUSING
150: LED SUBSTRATE
151: INFRARED LED
160: BRACKET
161: BRACKET BODY
166: METAL BODY
170: COVER HOUSING

What is claimed is:

1. A fish eye camera comprising:
a base housing;
a main circuit board fixed to an inside of the base housing;
a camera module which is connected to the main circuit board at the inside of the base housing and performs omnidirectional photographing through a fish eye lens;
a middle housing formed to cover both of the main circuit board and the camera module and fixed to the base housing in a state in which the fish eye lens is drawn from the middle housing;
a plurality of light emitting diode (LED) substrates each having at least one infrared LED mounted thereon and connected to the main circuit board;
a bracket including a bracket body, which is insertion-coupled to the LED substrates and elastically supports the LED substrates in a state in which the LED substrates are arranged around an outer side of the middle housing, and metal bodies which are inserted into the bracket body to be in contact with the LED substrates; and
a cover housing formed to cover both of the bracket and the middle housing and fixed to the base housing.

2. The fish eye camera of claim 1, wherein the bracket body is formed to be slidably insertion-coupled to the LED substrates.

3. The fish eye camera of claim 2, wherein the bracket body includes:
a center bracket portion formed to surround the fish eye lens from the outer side of the middle housing; and
holding portions which are arranged around an outer side of the center bracket portion, are slidably insertion-coupled to the LED substrates in a radial direction toward a center of the middle housing, and elastically support the LED substrates.

4. The fish eye camera of claim 3, wherein each of the holding portions includes:
a pair of supporting pieces which protrude from the outer side of the center bracket portion and are in contact with both sides of one surface of a corresponding LED substrate in a state in which the pair of supporting pieces are spaced apart from each other in a circumferential direction of the center bracket portion; and
an elastic piece which protrudes between the pair of supporting pieces from the outer side of the center bracket portion and elastically supports the other surface of a corresponding LED substrate.

5. The fish eye camera of claim 4, wherein the elastic piece includes a hooking step which protrudes to hook a rear end of a corresponding LED substrate in an insertion direction of the corresponding LED substrate.

6. The fish eye camera of claim 4, wherein the metal bodies are formed to be exposed from the pair of supporting pieces to be in contact with the LED substrates.

7. The fish eye camera of claim 1, wherein the metal bodies are formed to connect the LED substrates in series.

8. The fish eye camera of claim 7, wherein:
each of the LED substrates includes a first electrode and a second electrode connected to a corresponding infrared LED; and
the metal bodies include a first metal piece and a second metal piece, which are respectively in contact with the first electrode of any one LED substrate of two adjacent LED substrates and the second electrode of the other LED substrate thereof in any one region corresponding to a region between the two adjacent LED substrates, and a third metal piece which is in contact with both of the first electrode of any one LED substrate of two adjacent LED substrates and the second electrode of the other LED substrate thereof to electrically connect the first and second electrodes in each region corresponding to the remaining regions between the two adjacent LED substrates.

9. The fish eye camera of claim 1, wherein the metal bodies are integrated with the bracket body formed of a resin material by insert-injection molding.

10. The fish eye camera of claim 1, wherein the bracket body includes heat dissipation holes which expose the metal bodies.

* * * * *